(12) United States Patent
Kim et al.

(10) Patent No.: US 8,900,743 B2
(45) Date of Patent: Dec. 2, 2014

(54) BARRIER FOR THIN FILM LITHIUM BATTERIES MADE ON FLEXIBLE SUBSTRATES AND RELATED METHODS

(75) Inventors: Hyoncheol Kim, Ann Arbor, MI (US);
Marc Langlois, Ann Arbor, MI (US);
Myoungdo Chung, Ann Arbor, MI (US);
Ann Marie Sastry, Ann Arbor, MI (US);
Yen-Hung Chen, Ann Arbor, MI (US);
Stephen Buckingham, Ypsilanti, MI (US)

(73) Assignee: Sakti3, Inc., Ann Arbor, MI (US)

( * ) Notice: Subject to any disclaimer, the term of this patent is extended or adjusted under 35 U.S.C. 154(b) by 192 days.

(21) Appl. No.: 13/283,528

(22) Filed: Oct. 27, 2011

(65) Prior Publication Data
US 2012/0040233 A1 Feb. 16, 2012

(51) Int. Cl.
| | |
|---|---|
| *H01M 6/12* | (2006.01) |
| *H01M 6/02* | (2006.01) |
| *H01M 6/46* | (2006.01) |
| *H01M 10/052* | (2010.01) |
| *H01M 10/0585* | (2010.01) |
| *H01M 6/40* | (2006.01) |
| *C23C 14/56* | (2006.01) |
| *H01M 10/04* | (2006.01) |

(52) U.S. Cl.
CPC ........... *C23C 14/562* (2013.01); *H01M 10/052* (2013.01); *H01M 10/0585* (2013.01); *Y02E 60/122* (2013.01); *H01M 6/40* (2013.01); *H01M 10/0436* (2013.01); *Y02T 10/7011* (2013.01)
USPC ........... 429/162; 29/623.1; 429/126; 429/152

(58) Field of Classification Search
USPC .................................................. 429/152, 304
See application file for complete search history.

(56) References Cited

U.S. PATENT DOCUMENTS

| | | | |
|---|---|---|---|
| 5,561,004 A | 10/1996 | Bates et al. | |
| 6,994,933 B1 | 2/2006 | Bates | |
| 2003/0232248 A1* | 12/2003 | Iwamoto et al. | 429/233 |
| 2005/0008778 A1* | 1/2005 | Utsugi et al. | 427/248.1 |
| 2010/0190051 A1* | 7/2010 | Aitken et al. | 429/162 |
| 2010/0291431 A1* | 11/2010 | Shih et al. | 429/159 |

OTHER PUBLICATIONS

John B. Goodenough et al., "Challenges for Rechargeable Li Batteries", Chemistry of Materials, 2010, pp. 587-603, vol. 22.

(Continued)

*Primary Examiner* — Ula C. Ruddock
*Assistant Examiner* — Matthew Van Oudenaren
(74) *Attorney, Agent, or Firm* — Richard T. Ogawa; Ogawa P.C.

(57) ABSTRACT

A thin film solid state battery configured with barrier regions formed on a flexible substrate member and method. The method includes forming a bottom thin film barrier material overlying and directly contacting a surface region of a substrate. A first current collector region can be formed overlying the bottom barrier material and forming a first cathode material overlying the first current collector region. A first electrolyte can be formed overlying the first cathode material, and a second current collector region can be formed overlying the first anode material. The method also includes forming an intermediary thin film barrier material overlying the second current collector region and forming a top thin film barrier material overlying the second electrochemical cell. The solid state battery can comprise the elements described in the method of fabrication.

19 Claims, 8 Drawing Sheets

(56) References Cited

OTHER PUBLICATIONS

B.J. Neudecker et al., ""Lithium-Free" Thin-Film Battery with In Situ Plated Li Anode", Journal of the Electrochemical Society, 2000, pp. 517-523, vol. 147 (2).

B. Wang et al., "Characterization of Thin-Film Rechargeable Lithium Batteries with Lithium Cobalt Oxide Cathodes", Journal of the Electrochemical Society, 1996, pp. 3203-3213, vol. 143.

Arun Patil et al., "Issue and challenges facing rechargeable thin film lithium batteries", Materials Research Bulletin, 2008, pp. 1913-1942, vol. 43.

\* cited by examiner

BARRIER FOR THIN FILM LITHIUM BATTERIES MADE ON FLEXIBLE SUBSTRATES AND RELATED METHODS

BACKGROUND OF THE INVENTION

This present invention relates to manufacture of electrochemical cells. More particularly, the present invention provides a method and device for fabricating a solid state thin film battery device. Merely by way of example, the invention has been provided with use of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

Common electro-chemical cells often use liquid electrolytes. Such cells are typically used in many conventional applications. Alternative techniques for manufacturing electro-chemical cells include solid state cells. Such solid state cells are generally in the experimental state, have been difficult to make, and have not been successfully produced in large scale. Although promising, solid state cells have not been achieved due to limitations in cell structures and manufacturing techniques. These and other limitations have been described throughout the present specification and more particularly below.

Solid state batteries have been proven to have several advantages over conventional batteries using liquid electrolyte in lab settings. Safety is the foremost one. Solid state battery is intrinsically more stable than liquid electrolyte cells since it does not contain a liquid that causes undesirable reaction, resulting thermal runaway, and an explosion in the worst case. Solid state battery can store more energy for the same volume or more energy for the same mass than conventional batteries. Good cycle performance, more than 10,000 cycles, and good high temperature stability also has been reported.

Despite of these outstanding properties of solid state batteries, there are challenges to address in the future to make this type of batteries available in the market. To exploit the compactness and high energy density, no metal housing or excessive substrate should be used. To be used in variety of applications such as consumer electronics or electric vehicle, other than the current application, RFID, large area and fast film deposition techniques at low cost should be developed.

From the above, it is seen that techniques for improving solid state cells are highly desirable.

BRIEF SUMMARY OF THE INVENTION

According to the present invention, techniques related to the manufacture of electrochemical cells are provided. More particularly, the present invention provides a method and device for fabricating a solid state thin film battery device using barrier regions. Merely by way of example, the invention has been provided with use of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

In a solid-state battery, the electrochemical reactions occur between a cathode and an anode through a solid electrolyte layer that is electrically insulating and ionically conductive. This construction of thin films layers differentiates solid-state batteries from conventional liquid electrolyte based batteries, with higher energy and power densities and longer cycle life due to more efficient material usage and homogeneous charge, strain and heat distribution.

Physical vapor deposition (PVD) has been proven as one of the most effective methods to deposit thin film layers for solid-state batteries by purely physical processes such as condensation of a vaporized form of the material onto various surfaces. Specific implementations of PVD include: resistive heat evaporation, electron beam evaporation, sputtering, and pulsed laser deposition. PVD techniques have been shown to date, to be cost effective and scalable for solid-state battery manufacturing.

In the conventional liquid electrolyte based batteries, active materials including cathode and anode are pasted on metal foils of hundreds of micrometer thickness. However, in solid state batteries, thick metal foils cannot be used considering the negative effect of energy density of the thick metals compared to thin layers of active materials. As such metal layers as current collectors should rather be deposited on a substrate. For solid state batteries made by PVD to be cost effective, batteries should be made on a large scale substrate, especially a flexible moving substrate. The use of flexible web imposes a new challenge to batteries because the substrate contains material species including oxygen, moisture, nitrogen, and carbon dioxide that are detrimental to lithium. Also when constructing plurality of electrochemical cells in a stacked configuration, electrical insulation and mechanical stability between adjacent cells need to be adjusted as required. Thus, there are three locations in a electrochemical cell where protection of lithium from the environment is required: between substrate and electrochemical cell, between two adjacent electrochemical cells, and top surface of the whole battery.

We discovered that barrier layers in prior art are to protect lithium from gaseous species including oxygen and moisture existing in the atmosphere, which cause undesirable reaction. Those batteries presented in conventional work were made on a small substrate, typically with a few square inches of area with ideal conditions such as gold or platinum coating on a polished silicon wafer. These limitations, rigidity of the substrate, use of noble metal, and expensive substrate preparation hamper the exploiting the benefits of solid state batteries. These and other limitations have been overcome by the present methods and devices.

In a specific embodiment, the present invention provides a method for fabricating a solid-state battery device. The method includes providing a substrate having a surface region. The method includes forming a bottom thin film barrier material overlying and directly contacting the surface region of the substrate. Preferably, the bottom thin film barrier material is configured to prevent ionic species from a first anode material to migrate to the substrate. The method includes forming a first current collector region overlying the bottom barrier material and forming a first cathode material overlying the first current collector region. The method also includes forming a first electrolyte overlying the first cathode material, forming a second current collector region overlying the first anode material, and causing a strain condition associated with any combination of the first current collector region, the first cathode material, the first electrolyte, or the second current collector. Preferably, the first current collector region, the first cathode material, the first electrolyte, and the second current collector region form a first electrochemical cell. The method also includes forming an intermediary thin film barrier material overlying the second current collector region to compensate the stain condition and prevent migration of an ionic species from either the first electrochemical cell to an overlying second electrochemical cell or the second electrochemical cell to the first electrochemical cell. The method includes forming a top thin film barrier material overlying the second electrochemical cell. The top thin barrier material is configured to prevent an oxygen, water, nitrogen, and carbon dioxide from diffusing into either the second electrochemical cell or the first electrochemical cell and covering an entirety of the first electrochemical cell and the second electrochemical cell while exposing a first contact portion of the first current collector region and a second contact portion of the second current collector region.

In an alternative specific embodiment, the present invention provides a solid-state battery device. The device includes a substrate having a surface region and a bottom thin film barrier material overlying and directly contacting the surface region of the substrate. Preferably, the bottom thin film barrier material is configured to prevent ionic species from a first anode material to migrate to the substrate. The device includes a first current collector region overlying the bottom barrier material, a first cathode material overlying the first current collector region; a first electrolyte overlying the first cathode material, a second current collector region overlying the first anode material, and an intermediary thin film barrier material overlying the second current collector region. Preferably, the first current collector region, the first cathode material, the first electrolyte, and the second current collector region form a first electrochemical cell. The device has a second electrochemical cell overlying the second thin film barrier material. Preferably, the second electrochemical cell comprises a second anode material. The device also has a top thin film barrier material overlying the second electrochemical cell. Preferably, the top thin barrier material is configured to prevent an oxygen species, a water species, a nitrogen spices, and a carbon dioxide species from diffusing into either the second electrochemical cell or the first electrochemical cell and covering an entirety of the first electrochemical cell and the second electrochemical cell. The device has an exposed region formed within a portion of the top thin film barrier material to expose a first contact region of the first current collector and a second contact region of the second current collector. Preferably, the intermediary thin film barrier material configured to prevent migration of an ionic species from either the first electrochemical cell to the second electrochemical cell or the second electrochemical cell to the first electrochemical cell.

Benefits are achieved over conventional techniques. Depending upon the specific embodiment, one or more of these benefits may be achieved. In a preferred embodiment, the present invention provides a suitable solid state battery structure including barrier regions. Preferably, the barrier regions prevent electrical contact between the first current collector and the second current collector as an electrical insulation layer when metallic substrates are used to form electrochemical cells. The intermediary thin film barrier can be configured to mitigate stresses existing in electrode materials. Of course, there can be other variations, modifications, and alternatives.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
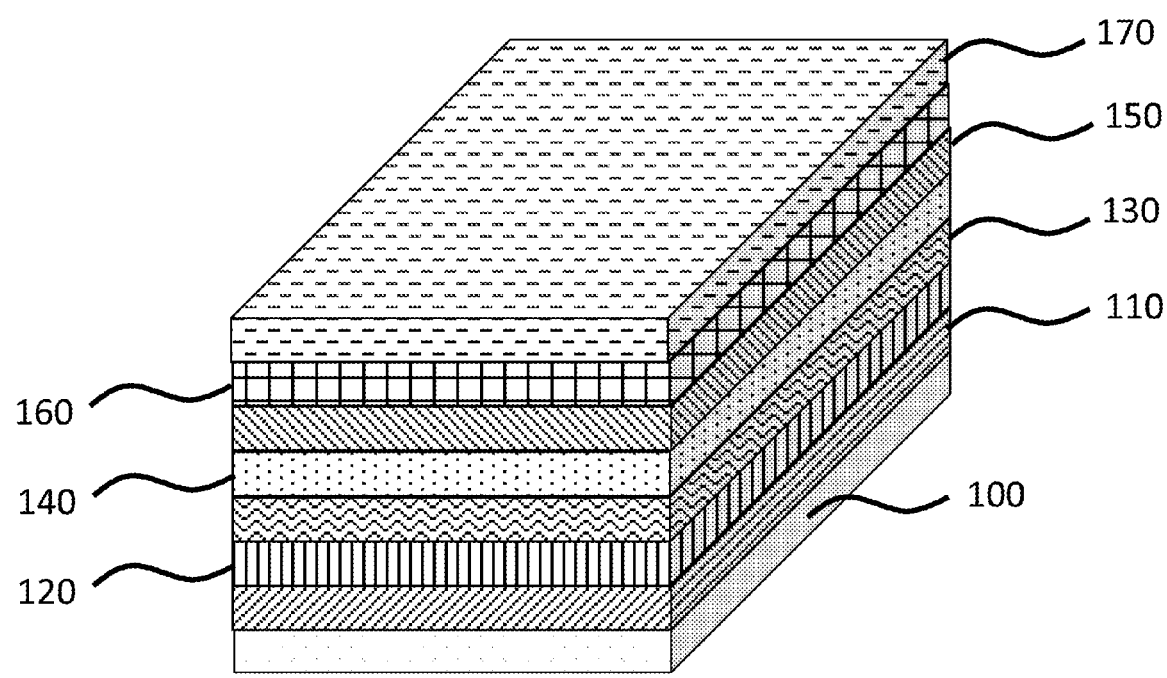
FIG. 1 is a simplified schematic diagram illustrating a perspective cross-sectional view of a thin film electrochemical cell according to an embodiment of the present invention.

According to the present invention, techniques related to the manufacture of electrochemical cells are provided. More particularly, the present invention provides a method and device for fabricating a solid state thin film battery device using barrier regions. Merely by way of example, the invention has been provided with use of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

Embodiments in accordance with the present invention relate to apparatus for manufacturing electrochemical cells with a barrier layer by reel-to-reel deposition. The barrier layer is an additional layer to the battery that protects the battery from exposing to environment air and moisture, and contacting any surfaces that may alter the property of battery layers by unintended reaction. The deposition of the electrochemical cells and the barrier layer can be made in a single vacuum chamber with multiple evaporation sources or multiple vacuum chambers with dedicated evaporation source in each chamber.

In a specific embodiment, the present invention provides a method for fabricating a solid-state battery device. The method includes providing a substrate having a surface region. The substrate can be selected from a copper material, an aluminum material, a polymer material, or other like material, or combination thereof. The method includes forming a bottom thin film barrier material overlying and directly contacting the surface region of the substrate. Preferably, the bottom thin film barrier material is configured to prevent ionic species from a first anode material to migrate to the substrate. In a specific embodiment, the ionic species can comprise lithium ions, or the like. The method includes forming a first current collector region overlying the bottom barrier material and forming a first cathode material overlying the first current collector region.

The method also includes forming a first electrolyte overlying the first cathode material, forming a second current collector region overlying the first anode material, and causing a strain condition associated with any combination of the first collector region, the first cathode material, the first electrolyte, or the second current collector. Preferably, the first current collector region, the first cathode material, the first electrolyte, and the second current collector region form a first electrochemical cell.

The method also includes forming an intermediary thin film barrier material overlying the second current collector region to compensate the stain condition and prevent migration of an ionic species from either the first electrochemical cell to an overlying second electrochemical cell or the second electrochemical cell to the first electrochemical cell. In a specific embodiment, the intermediary thin film barrier material is configured to planarize an upper surface region of the first electrochemical cell. This intermediary thin film barrier material can also be configured in a compressive or tensile mode to compensate the strain condition of the first electrochemical cell.

The method also includes forming a top thin film barrier material overlying the second electrochemical cell. The top thin barrier material is configured to prevent an oxygen, water, nitrogen, and carbon dioxide from diffusing into either the second electrochemical cell or the first electrochemical cell and covering an entirety of the first electrochemical cell and the second electrochemical cell while exposing a first contact portion of the first current collector region and a second contact portion of the second current collector region. In a specific embodiment, the top thin film barrier material can be coated to package and enclose the first electrochemical cell and the second electrochemical cell, wherein the coating comprises a polymer based material.

In a specific embodiment, the bottom thin film barrier material, the intermediary thin film barrier material, and the top thin film barrier material are made of an oxide of metal or metalloid, nitride of metal or metalloid, carbide of metal or metalloid, or phosphate of metal. Also, these three thin film barrier materials can be provided by physical vapor deposition including sputtering, heat resistive evaporation, and e-beam evaporation. Each of these layers can also have a thickness ranging from about 30 nm to about 100 nm. Those of ordinary skill in the art will recognize other variations, modifications, or alternatives.

In an alternative specific embodiment, the present invention provides a solid-state battery device. The device includes a substrate having a surface region and a bottom thin film barrier material overlying and directly contacting the surface region of the substrate. Preferably, the bottom thin film barrier material is configured to prevent ionic species from a first anode material to migrate to the substrate. The device includes a first current collector region overlying the bottom barrier material, a first cathode material overlying the first current collector region; a first electrolyte overlying the first cathode material, a second current collector region overlying the first anode material, and an intermediary thin film barrier material overlying the second current collector region. Preferably, the first current collector region, the first cathode material, the first electrolyte, and the second current collector region form a first electrochemical cell. The device has a second electrochemical cell overlying the second thin film barrier material. Preferably, the second electrochemical cell comprises a second anode material. The device also has a top thin film barrier material overlying the second electrochemical cell.

Preferably, the top thin barrier material is configured to prevent an oxygen species, a water species, a nitrogen spices, and a carbon dioxide species from diffusing into either the second electrochemical cell or the first electrochemical cell and covering an entirety of the first electrochemical cell and the second electrochemical cell. The device has an exposed region formed within a portion of the top thin film barrier material to expose a first contact region of the first current collector and a second contact region of the second current collector. Preferably, the intermediary thin film barrier material configured to prevent migration of an ionic species from either the first electrochemical cell to the second electrochemical cell or the second electrochemical cell to the first electrochemical cell.

Details regarding the individual elements and configuration of the elements in embodiments of the battery device can be found above in the description of the method embodiments. Of course, those skilled in the art will recognize other variations, modifications, and alternatives.

Benefits are achieved over conventional techniques. Depending upon the specific embodiment, one or more of these benefits may be achieved. In a preferred embodiment, the present invention provides a suitable solid state battery structure including barrier regions. Preferably, the barrier regions prevent electrical contact between the first current collector and the second current collector as an electrical insulation layer when metallic substrates are used to form electrochemical cells. The intermediary thin film barrier can be configured to mitigate stresses existing in electrode materials. Of course, there can be other variations, modifications, and alternatives.

FIG. 1 is a simplified schematic diagram illustrating a perspective cross-sectional view of a thin film electrochemical cell according to an embodiment of the present invention. Particularly, FIG. 1 shows an embodiment of a single electrochemical cell with a bottom barrier material and an intermediary barrier material formed according to an embodiment of the present invention. The materials for the electrochemical cells are substrate 100, bottom barrier material 110, first current collector 120, cathode 130, electrolyte 140, anode 150, second current collector 160, and intermediary barrier material 170. Each of these elements can comprise a variety of materials depending upon the application and desired performance.

In a specific embodiment, the substrate 100 can be made of polymer films including polyethylene terephthalate, polyethylene naphthalate, polyimide, or metal films including copper, stainless steel, aluminum, nickel with thickness ranging from 1.5 μm to 30 μm.

In a specific embodiment, the bottom barrier 110 material is tantalum, titanium, aluminum oxide, silicon oxide, lithium phosphate, titanium nitride, tantalum nitride, or combinations of above with thickness ranging from 30 nm to 100 nm, among others.

In a specific embodiment, the first current collector 120 and/or second currently collector 160 can be nickel, copper, chromium, and titanium with thickness ranging from 30 nm to 100 nm.

In a specific embodiment, the cathode 130 can be cobalt oxide, nickel oxide, manganese oxide, vanadium oxide, iron phosphate, nickel phosphate, copper phosphate with thickness ranging from 0.5 μm to 3 μm.

In a specific embodiment, the electrolyte 140 can be any lithium conducting ternary or quaternary compounds containing lithium, phosphorus, boron, sulfur, tungsten, and/or nitrogen. Thickness of the electrolyte ranges from 0.1 μm to 0.5 μm.

In a specific embodiment, the anode 150 can be lithium, graphite, non-graphitic carbon, lithium titanate, silicon, and lithium alloy.

In a specific embodiment, the intermediary barrier material 170 can be tantalum, titanium, aluminum oxide, silicon oxide, lithium phosphate, titanium nitride, tantalum nitride, or combinations of above with thickness ranging from 30 nm to 100 nm, among others.

These materials, as well as others, can be incorporated into the solid-state battery device in one or more embodiments according to the present invention. Of course, those of ordinary skill in the art will recognize other variations, modifications, and alternatives to the materials and construction listed above.

Figure 2:
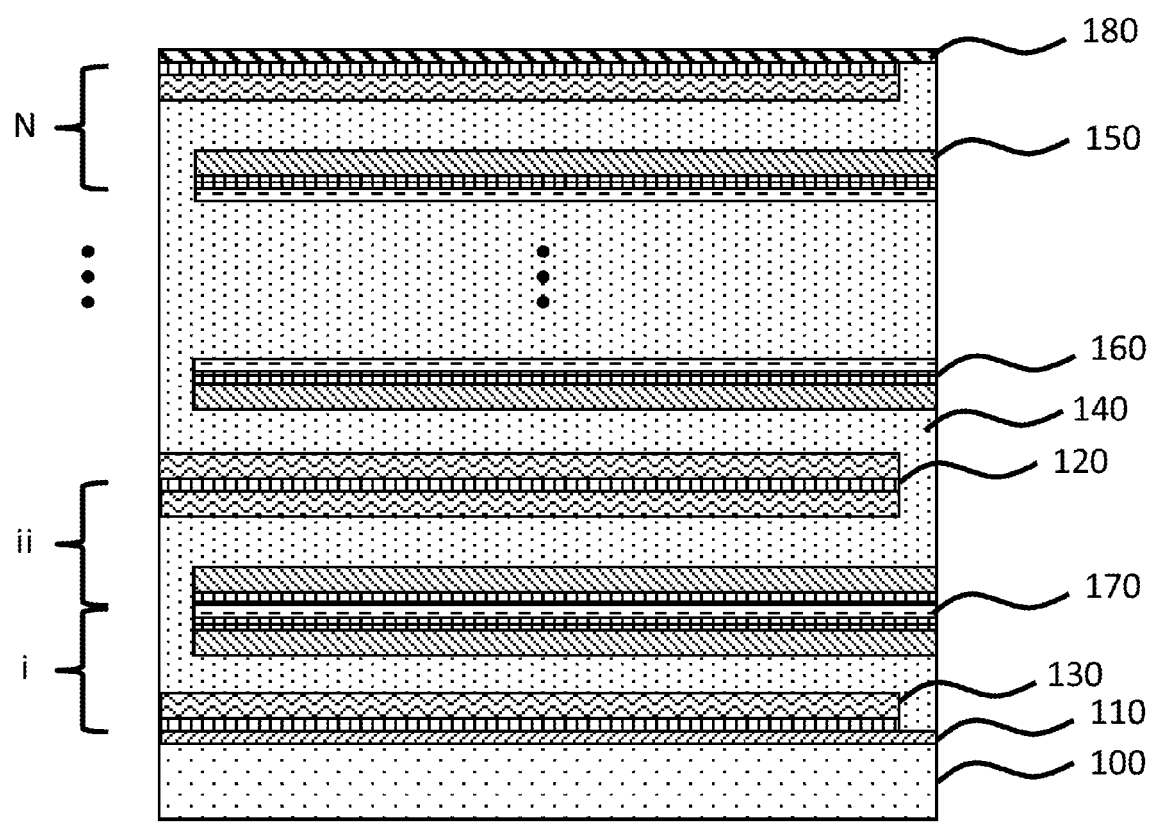
FIG. 2 is a simplified schematic diagram illustrating a side cross-sectional view of a thin film electrochemical cell according to an embodiment of the present invention.

FIG. 2 is a simplified schematic diagram illustrating a side cross-sectional view of a thin film electrochemical cell according to an embodiment of the present invention. Particularly, FIG. 2 shows a plurality of electrochemical cells with a bottom barrier material, an intermediary barrier material, and a top barrier material formed according to an embodiment of the present invention. The view of the embodiment shown in FIG. 2 can be an alternative view of the embodiment shown in FIG. 1. The materials for the electrochemical cells are substrate 100, bottom barrier material 110, first current collector 120, cathode 130, electrolyte 140, anode 150, second current collector 160, intermediary barrier material 170, and top barrier material 180. A plurality of electrochemical cells, numbered from i to N (shown in FIG. 2), where N is an integer greater than 1000, is stacked. In a specific embodiment, the plurality of electrochemical cells, or a solid-state battery device having a plurality of electrochemical cells, can be numbered from 3 to N, where N is an integer greater than 1000. The plurality of electrochemical cells can be configured between the second electrochemical cell and the top thin film barrier material. Of course, there can be other variations, modifications, and alternatives.

Figure 3:
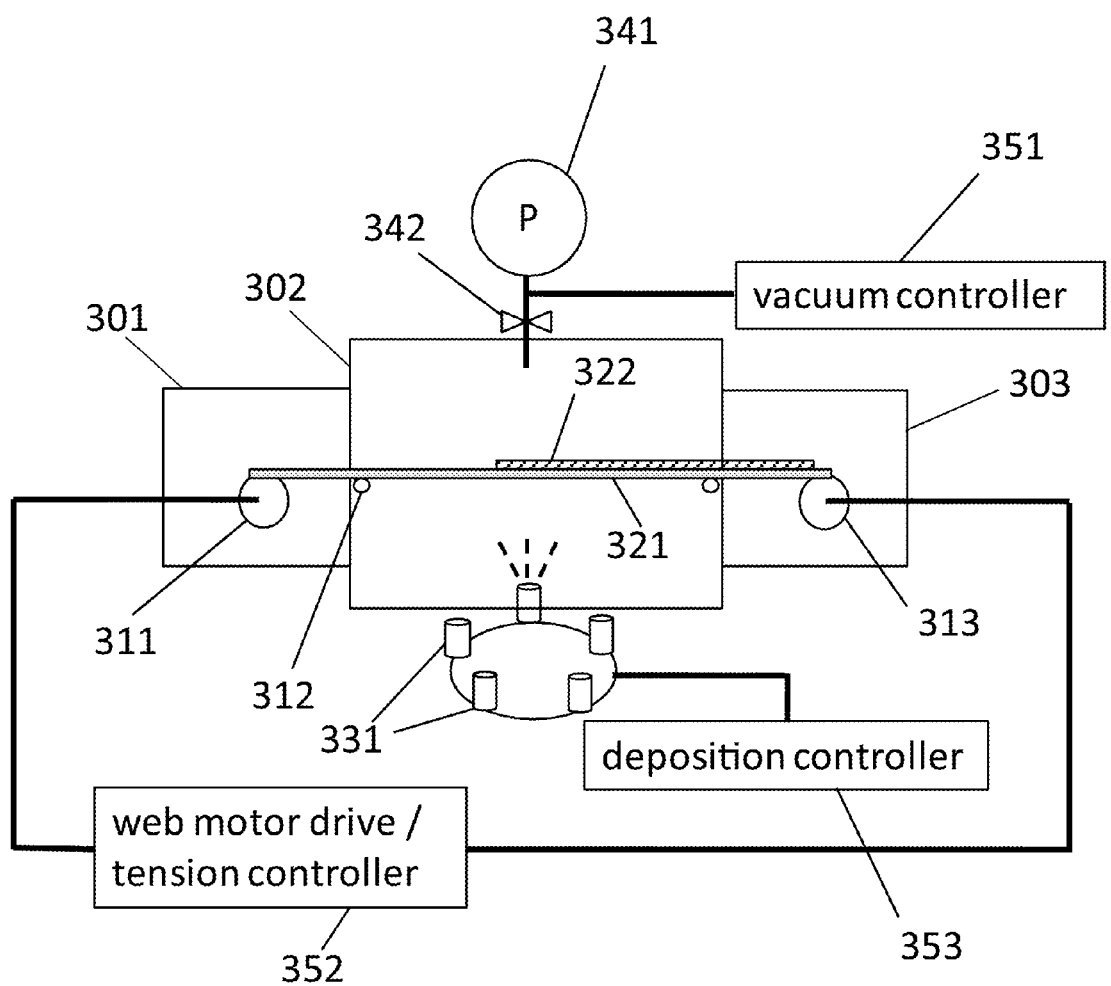
FIG. 3 is a simplified schematic diagram illustrating an apparatus configured for a method of fabricating an electrochemical cell according to an embodiment of the present invention.
Figure 4:
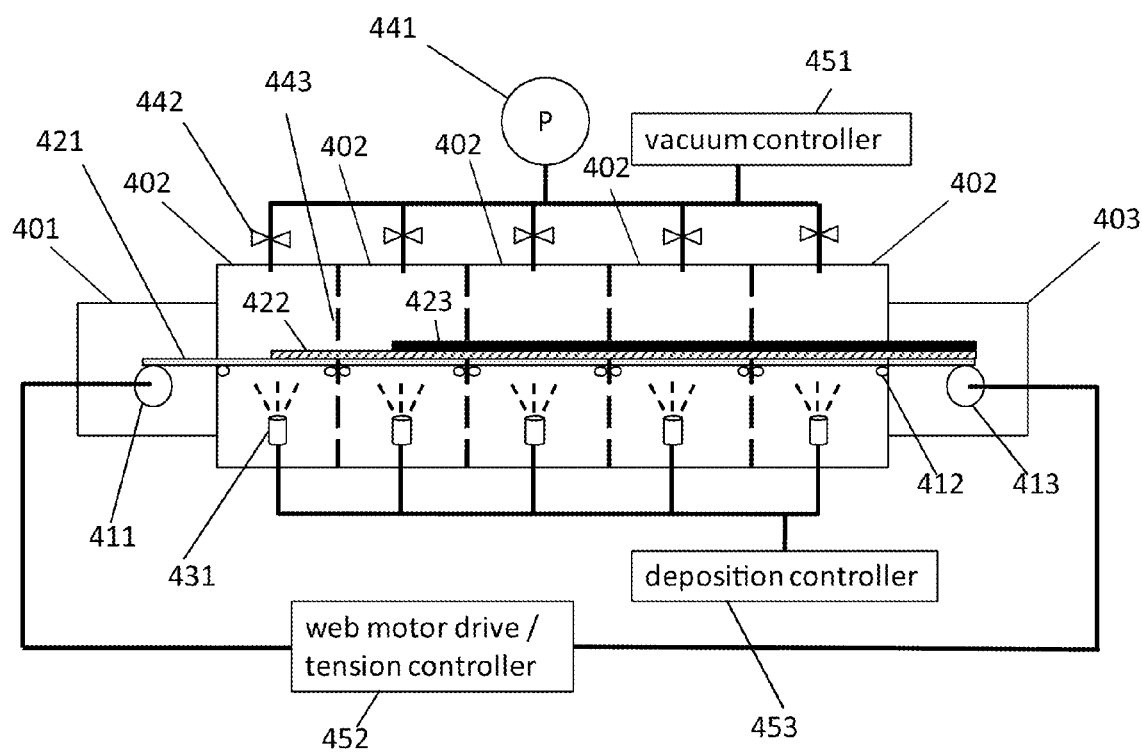
FIG. 4 is a simplified schematic diagram illustrating an apparatus configured for a method of fabricating an electrochemical cell according to an embodiment of the present invention.

FIG. 3 is a simplified schematic diagram illustrating an apparatus configured for a method of fabricating an electrochemical cell according to an embodiment of the present invention. In an embodiment, the method of forming the battery materials includes forming barrier materials 322 onto a flexible moving substrate in a single deposition chamber using alternating deposition sources. In particular, the apparatus of FIG. 3 comprises supply chamber 301, evacuation chamber 303, and a vacuum deposition chamber 302. The vacuum deposition chamber 302 is configured to deposit thin films of materials making up an electrochemical cell and the barrier materials. The vacuum deposition chamber 302 is in fluid communication with a plurality of material sources allowing deposition of one or more of the following layers using alternating sources 331: an anode, a cathode, an electrolyte, a current collector, and a barrier material. Deposition controller 353 selects a right source for each material and controls power to the selected evaporation sources. The apparatus is equipped with unwinder 311, winder 313, supporting rollers 312, and controller 352 for applying tension and moving a substrate web 321. The apparatus maintains proper level of vacuum during process depending on the process selected for each material to be deposited using a pump system 341, a valve system 342, and a vacuum controller 351. Those skilled in the art will recognize other variations, modifications, and alternatives for constructions on an apparatus FIG. 4 is a simplified schematic diagram illustrating an apparatus configured for a method of fabricating an electrochemical cell according to an embodiment of the present invention. In an embodiment, the method of forming battery materials can include barrier materials 422, 423 onto a moving substrate by roll in serially connected multiple chambers. In particular, the apparatus of FIG. 4 comprises supply chamber 401, evacuation chamber 403, and a vacuum deposition chamber 402 for each material of the electrochemical cell. The vacuum deposition chamber 402 is configured to deposit thin films of materials making up an electrochemical cell. Deposition controller 453 controls evaporation sources 431 in each chamber to make appropriate materials of electrochemical cells. A web 421 moves through each chamber by the unwinder 411, winder 413, and supporting rollers 412 where the tension and the speed are controlled by the web motor drive/tension controller 452. Each chamber maintains proper vacuum level via use of pump system 441, valve system 442, and computerized vacuum controller 451. Similar to the apparatus shown in FIG. 3, the apparatus shown in FIG. 4 can have variations, modifications, and alternatives for the purpose of effecting a method of fabricating an electrochemical cell according to an embodiment of the present invention.

Figure 5:
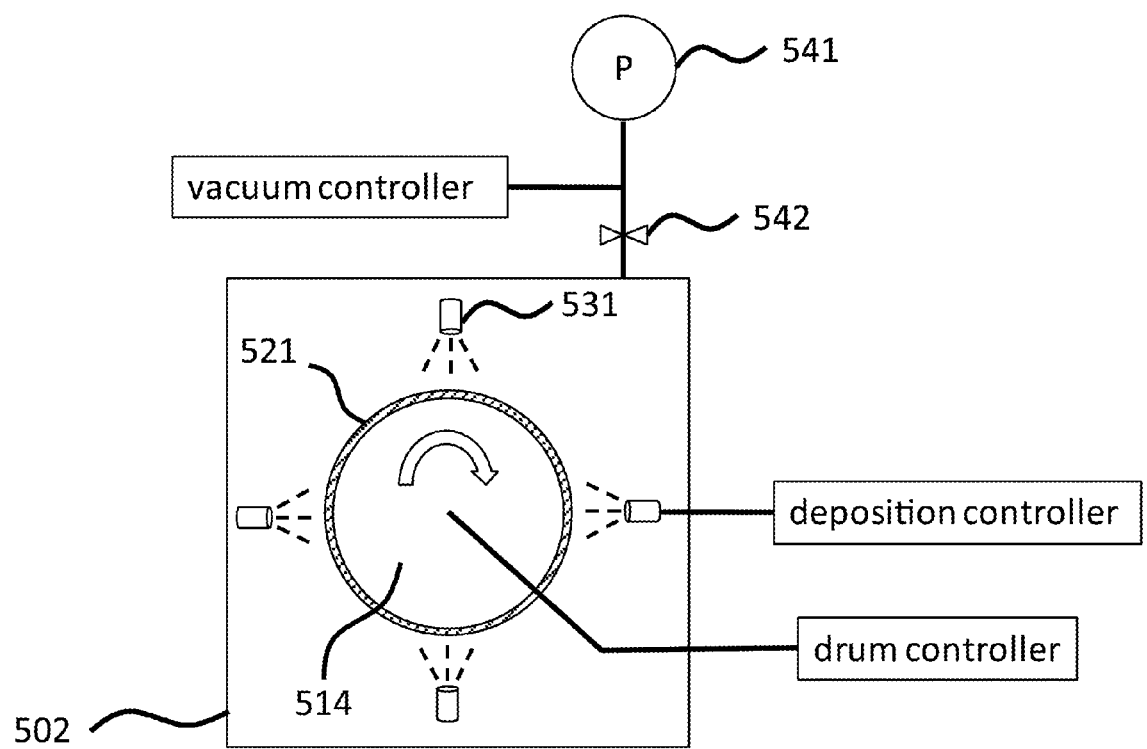
FIG. 5 is a simplified schematic diagram illustrating an apparatus configured for a method of fabricating an electrochemical cell according to an embodiment of the present invention.

FIG. 5 is a simplified schematic diagram illustrating an apparatus configured for a method of fabricating an electrochemical cell according to an embodiment of the present invention. In an embodiment, the method can include continuously forming battery materials and barrier materials onto a substrate encircling a drum using deposition sources placed at desired locations. In particular, the apparatus of FIG. 5 comprises a vacuum deposition chamber 502. The vacuum deposition chamber is configured to deposit thin films of materials making up electrochemical cells and barrier materials. The apparatus is equipped with a drum 514, substrate 521, deposition sources 531, vacuum pumps 541, valves 542, controllers of drum motion and temperature, deposition sources, and vacuum pumping system. There can be other variations, modifications, and alternatives.

Figure 6A:
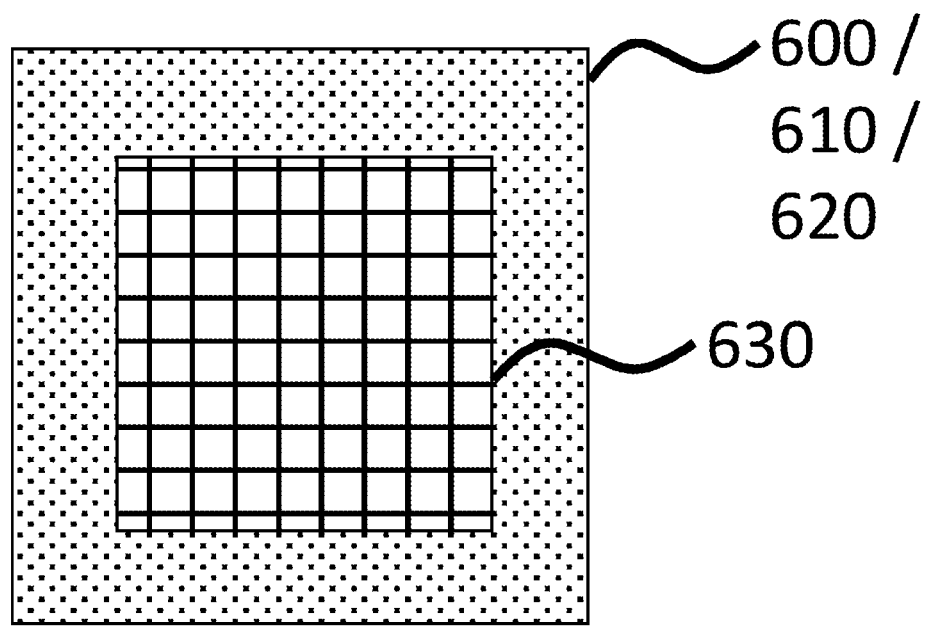
FIGS. 6A and 6B are simplified diagrams illustrating a bottom barrier material according to an embodiment of the present invention.
Figure 6B:
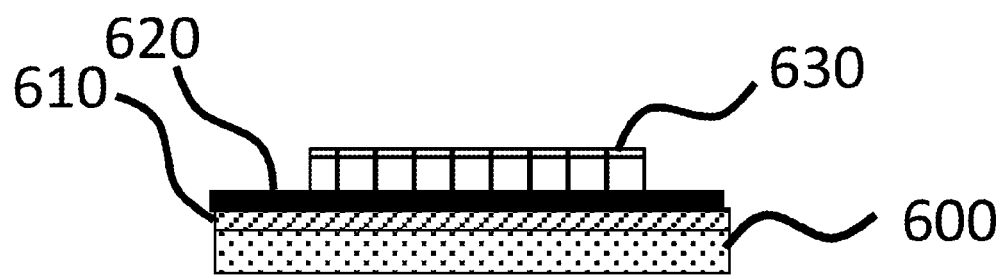

FIGS. 6A and 6B are simplified diagrams illustrating a bottom barrier material according to an embodiment of the present invention. These figures illustrate the effect of having a bottom layer 610 in preventing lithium diffusion through conductive material 620, into a substrate 600. FIGS. 6A and 6B depict a top and side view, respectively, having a substrate 600, a bottom barrier material 610, a conductive material 620, and an electrode material 630. In case where there is no bottom barrier material, lithium disappears over time from the top and discoloration occurs indicating reaction of lithium with the substrate 600. In a specific embodiment, the lithium of the battery device having the bottom barrier material 610 remains intact from the top view, and the bottom view does not reveal discoloration.

Figure 7:
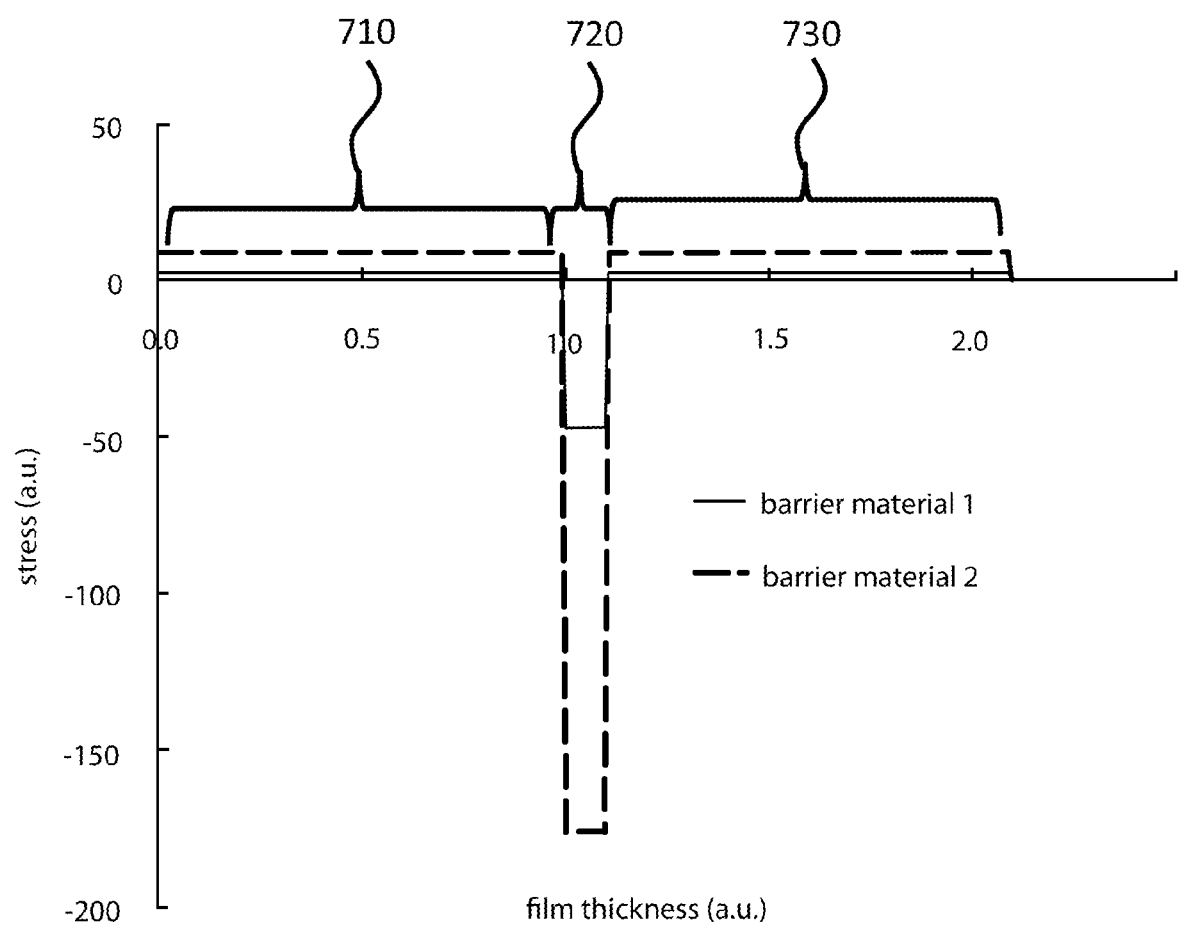
FIG. 7 is a simplified diagram illustrating a graph of stress characteristics of an intermediary barrier material according to an embodiment of the present invention.

FIG. 7 is a simplified diagram illustrating a graph of stress characteristics of an intermediary barrier material according to an embodiment of the present invention. This figure illustrates a computer simulation graph result of a specific example of use of intermediary barrier material wherein the barrier material is used to mitigate stresses in cell active materials including cathode and anode. This example shows results from a device that comprises a first electrode material 710, an intermediary barrier material 720, and a second electrode material 730. Stress measurements are shown across the thickness of the film and broken down into the respective first electrode 710, intermediary barrier 720, and second electrode 730 sections. Stresses existing in active materials can be reduced by choosing an intermediary barrier material with a desirable mechanical property or varying process conditions of forming the intermediary barrier material.

Figure 8A:
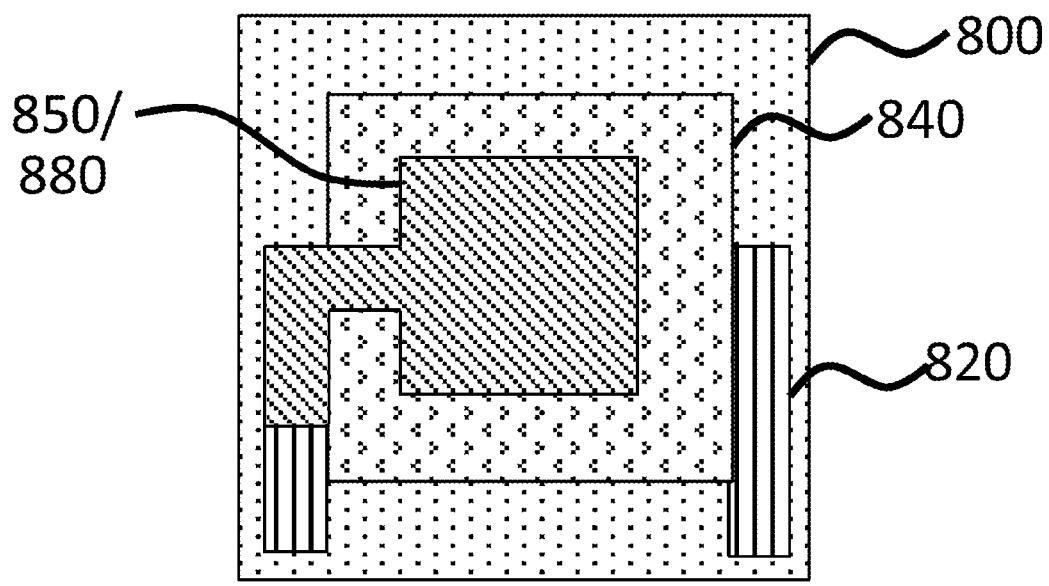
FIGS. 8A and 8B are simplified diagrams illustrating a battery device according to an embodiment of the present invention.
Figure 8B:
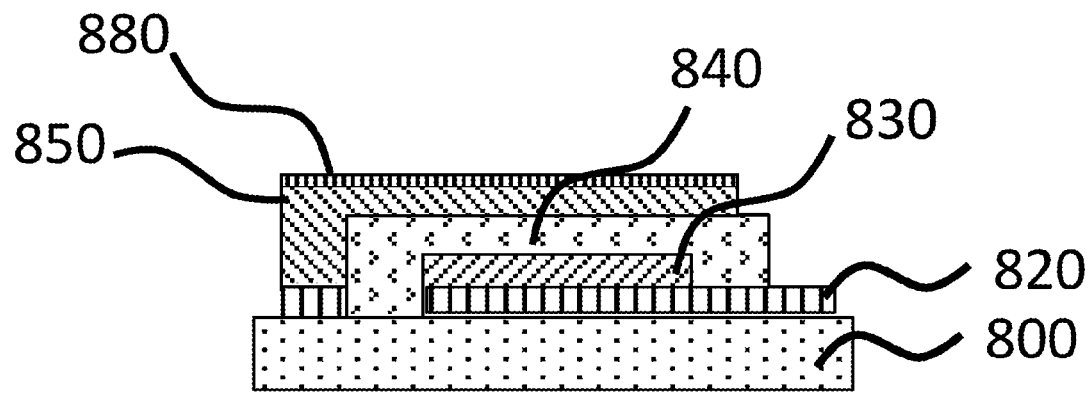

FIGS. 8A and 8B are simplified diagrams illustrating a battery device according to an embodiment of the present invention. In an embodiment, the battery device includes a top layer that prevents the lithium from reacting with gaseous species including oxygen, water, nitrogen, and carbon dioxide in the environment. FIGS. 8A and 8B are top and side views, respectively, of a schematic diagram describing the structure of a formed electrochemical cell. The cell includes a substrate 800, current collector 820, electrolyte 840, anode 850, and top barrier material 880. In a specific embodiment, the anode 850 in the sample with a top barrier material 880 retains the shiny metallic color whereas an anode, which does not have a top barrier material, turns dark, indicating the lithium is oxidized.

The invention will be further clarified by the following example (referencing FIG. 1 and FIG. 2): A method of forming a thin film battery comprising barrier layers 110, 170, and 180 includes providing a substrate 100 having formed thereon separate patterned layers of nickel, which serve as the first current collectors 120.

A bottom barrier material 110 is formed over the substrate 100 to prevent any undesirable transport and reaction between the electrochemical cell and the substrate. The bottom barrier material can be formed, for example, by e-beam evaporating $Al_2O_3$ to make about 50 nm thick layer. The deposition rate can range from 0.1 to 10 Å/s. Advantageously, the barrier material is formed using a material having an inherently low permeability to oxygen and water and the barrier material, once formed, is substantially free of defects that would otherwise permit oxygen and/or water from passing there through.

A cathode layer 130 is formed over the cathode current collector 120. The cathode layer 130, which may be formed by thermal evaporation through a suitably patterned mask, may comprise $V_2O_5$ or, alternatively, $LiMnO_2$, $LiFeO_2$, $LiNiO_2$ or $LiCoO_2$, for example. In a thermal evaporation tool, the cathode source material is continuously fed to the evaporation area by a transport apparatus, and the evaporation area comprising refractory metals or ceramics is heated over the boiling temperature of the said source material. During the evaporation, the substrate temperature is maintained at a constant level ranging from −15 to 40 degrees C. Additional gaseous species comprising nitrogen, argon, and oxygen can be introduced by ion beam irradiation on the substrate while cathode is deposited, or as a background gas.

After forming the cathode layer, the electrolyte layer 140 is formed, for example, by e-beam evaporation or thermal evaporation through a suitable mask. Exemplary e-beam evaporation conditions for forming the electrolyte layer include a power of about 400 W in conjunction with a use of nitrogen ion beam where the ion beam power can be from 300 W to 2000 W.

After forming the electrolyte layer 140, an anode layer 150 is formed over the electrolyte 140. In the example of an anode layer formed using lithium metal, the anode layer can be formed by thermal evaporation. The thermal evaporation apparatus comprises a tantalum or stainless steel container that is continuously fed with metal lithium by a source transport apparatus.

A top barrier material 180 is formed over the anode 150 to protect the anode from the environment containing moisture, oxygen, nitrogen, and carbon dioxide. The top barrier material can be formed, for example, by e-beam evaporating $Li_3PO_4$ to make about 50 nm thick layer and the deposition rate can range from 0.1 to 10 Å/s. This top barrier material should be formed without breaking vacuum in the chamber after forming anode material to preserve the anode of high quality. The barrier layer material is advantageously nonreactive toward the cathode, anode and electrolyte materials.

The barrier materials 110, 170, and 180 can be formed from materials including lithium phosphate, aluminum oxide, silicon oxide, tin oxide, tantalum nitride, titanium nitride or pure metals including titanium, nickel, tantalum. The barrier material can comprise a single, homogeneous layer, or a composite layer. A composite barrier layer may comprise one or more spatially-varying properties, including composition, degree of crystallinity, crystal grain size and shape, crystalline orientation, elastic modulus, mechanical strength, density, type and number of defects, etc.

In embodiments containing intermediary barrier materials 170, residual stress existing in electrode materials by selecting appropriate mechanical properties for the barrier material. As stated previously, FIG. 7 shows a computer simulation result where the mechanical stresses in electrode 410 and 430 with barrier material 1 (line 1) can be reduced to ⅓ of its original value when barrier material 2 (line 2) is used.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating a solid state battery device comprising a plurality of battery cells arranged in a stack configuration using a continuous process, the method comprising:
   providing a substrate having a surface region, the substrate having a flexible characteristic;
   transferring the substrate into a vacuum process;
   forming a bottom thin film barrier material overlying and directly contacting the surface region of the substrate, the bottom thin film barrier material configured to prevent ionic species from a first anode material to migrate to the substrate;

forming a first current collector region overlying the bottom barrier material;

forming a first cathode material overlying the first current collector region;

forming a first electrolyte overlying the first cathode material;

forming a second current collector region overlying the first anode material;

causing a strain condition comprising a stress associated with any combination of the first collector region, the first cathode material, the first electrolyte, or the second current collector; whereupon the first current collector region, the first cathode material, the first electrolyte, and the second current collector region form a first electrochemical cell;

forming an intermediary thin film barrier material overlying the second current collector region to compensate the strain condition causing a reduction in the stress associated with any combination of the first collector region, the first cathode material, first electrolyte, or the second current collector and prevent migration of an ionic species from either the first electrochemical cell to an overlying second electrochemical cell or the second electrochemical cell to the first electrochemical cell;

forming a top thin film barrier material overlying the second electrochemical cell, the top thin barrier material being configured to prevent an oxygen, water, nitrogen, or carbon dioxide from diffusing into either the second electrochemical cell or the first electrochemical cell and covering an entirety of the first electrochemical cell and the second electrochemical cell while exposing a first contact portion of the first current collector region and a second contact portion of the second current collector region;

continuously forming a plurality of electrochemical cells numbered from 3 to N, where N is an integer greater than 1000, configured between the second electrochemical cell and the top thin film barrier material; and whereupon forming the bottom thin film barrier material, forming the first current collector region, forming the first cathode material, forming the first electrolyte, forming the second current collector region overlying the first anode material, causing a strain condition, forming the intermediary thin film barrier material, forming the top thin film barrier material, and forming the plurality of electrochemical cells numbered from 3 to N, where N is an integer greater than 1000, configured between the second electrochemical cell and the top thin film barrier material are maintained under the vacuum process;

wherein the reduction of stress is one third of a value of stress of any combination of the first collector region, the first cathode material, first electrolyte, or the second current collector without the intermediary thin film barrier material.

2. The method of claim 1 wherein the ionic species comprises a lithium ion.

3. The method of claim 1 wherein the bottom thin film barrier material, the intermediary thin film barrier material, and the top thin film barrier material are made of an oxide of metal or metalloid, nitride of metal or metalloid, carbide of metal or metalloid, or phosphate of metal.

4. The method of claim 1 wherein the bottom thin film barrier material, the intermediary thin film barrier material, and the top thin film barrier material are provided by physical vapor deposition including sputtering, heat resistive evaporation, and e-beam evaporation.

5. The method of claim 1 wherein the bottom thin film barrier material, the intermediary thin film barrier material, and the top thin film barrier material each have a thickness ranging from about 30 nm to 100 nm; wherein the substrate having the flexible characteristic has a thickness ranging from about 1.5 microns to about 30 microns; wherein the first cathode ranges in thickness from about 0.5 microns to about 3 microns; wherein the first electrolyte ranges in thickness from about 0.1 microns to about 0.5 microns; wherein each of the first current collector region and the second current collector region ranges in thickness from about 30 to about 100 microns; wherein the plurality of battery cells are configured in a roll.

6. The method of claim 1 wherein the substrate is selected from a copper material, an aluminum material, or a polymer material.

7. The method of claim 1 wherein the intermediary thin film barrier material is configured to planarize an upper surface region of the first electrochemical cell.

8. The method of claim 1 wherein the intermediary thin film barrier material is configured in a compressive or tensile mode to compensate the strain condition of the first electrochemical cell.

9. The method of claim 1 further comprising coating the to top thin film barrier material to package and enclose the first electrochemical cell and the second electrochemical cell; wherein the coating comprises a polymer based material.

10. A method for fabricating a solid state battery device comprising a plurality of battery cells arranged in a stack configuration, the method comprising:

providing a substrate having a surface region, the substrate having a flexible characteristic;

forming a bottom thin film barrier material overlying and directly contacting the surface region of the substrate, the bottom thin film barrier material configured to prevent ionic species from a first anode material to migrate to the substrate;

forming a first current collector region overlying the bottom barrier material;

forming a first cathode material overlying the first current collector region;

forming a first electrolyte overlying the first cathode material;

forming a second current collector region overlying the first anode material;

causing a strain condition comprising a stress associated with any combination of the first collector region, the first cathode material, the first electrolyte, or the second current collector; whereupon the first current collector region, the first cathode material, the first electrolyte, and the second current collector region form a first electrochemical cell;

forming an intermediary thin film barrier material overlying the second current collector region to compensate the strain condition causing a reduction in the stress associated with any combination of the first collector region, the first cathode material, first electrolyte, or the second current collector and prevent migration of an ionic species from either the first electrochemical cell to an overlying second electrochemical cell or the second electrochemical cell to the first electrochemical cell;

forming a top thin film barrier material overlying the second electrochemical cell, the top thin barrier material being configured to prevent an oxygen, water, nitrogen, and carbon dioxide from diffusing into either the second electrochemical cell or the first electrochemical cell and covering an entirety of the first electrochemical cell and the second electrochemical cell while exposing a first contact portion of the first current collector region and a second contact portion of the second current collector region; and forming a plurality of electrochemical cells numbered from 3 to N configured between the second electrochemical cell and the top thin film barrier material;

wherein the bottom thin film barrier material, the intermediary thin film barrier material, and the top thin film barrier material each have a thickness ranging from about 30 nm to about 100 nm; wherein the substrate having the flexible characteristic has a thickness ranging from about 1.5 microns to about 30 microns; wherein the first cathode ranges in thickness from about 0.5 microns to about 3 microns; wherein the first electrolyte ranges in thickness from about 0.1 microns to about 0.5 microns; wherein each of the first current collector region and the second current collector region ranges in thickness from about 30 to about 100 microns;

wherein the reduction of stress is one third of a value of stress of any combination of the first collector region, the first cathode material, first electrolyte, or the second current collector without the intermediary thin film barrier material.

11. The method of claim 10 wherein the ionic species comprises a lithium ion; wherein N is an integer greater than 1000.

12. The method of claim 10 wherein the bottom thin film barrier material, the intermediary thin film barrier material, and the top thin film barrier material are made of an oxide of metal or metalloid, nitride of metal or metalloid, carbide of metal or metalloid, or phosphate of metal.

13. The method of claim 10 wherein the bottom thin film barrier material, the intermediary thin film barrier material, and the top thin film barrier material are provided by physical vapor deposition including sputtering, heat resistive evaporation, or e-beam evaporation.

14. The method of claim 10 wherein the substrate is selected from a copper material, an aluminum material, or a polymer material.

15. The method of claim 10 wherein the intermediary thin film barrier material is configured to planarize an upper surface region of the first electrochemical cell.

16. The method of claim 10 wherein the intermediary thin film barrier material is configured in a compressive or tensile mode to compensate the strain condition of the first electrochemical cell; wherein the plurality of battery cells are configured in a roll.

17. The method of claim 10 further comprising coating the top thin film barrier material to package and enclose the first electrochemical cell and the second electrochemical cell; wherein the coating comprises a polymer based material.

18. A method for fabricating a solid state battery device comprising a plurality of battery cells arranged in a stack configuration and formed in a continuous process under a vacuum environment, the method comprising:

providing a substrate having a surface region, the substrate having a flexible characteristic;

forming a bottom thin film barrier material overlying and directly contacting the surface region of the substrate, the bottom thin film barrier material configured to prevent ionic species from a first anode material to migrate to the substrate;

forming a first current collector region overlying the bottom barrier material;

forming a first cathode material overlying the first current collector region;

forming a first electrolyte overlying the first cathode material;

forming a second current collector region overlying the first anode material;

causing a strain condition comprising a stress associated with any combination of the first collector region, the first cathode material, the first electrolyte, or the second current collector; whereupon the first current collector region, the first cathode material, the first electrolyte, and the second current collector region form a first electrochemical cell;

forming an intermediary thin film barrier material overlying the second current collector region to compensate the strain condition causing a reduction in the stress associated with any combination of the first collector region, the first cathode material, first electrolyte, or the second current collector and prevent migration of an ionic species from either the first electrochemical cell to an overlying second electrochemical cell or the second electrochemical cell to the first electrochemical cell;

forming a top thin film barrier material overlying the second electrochemical cell, the top thin barrier material being configured to prevent an oxygen, water, nitrogen, and carbon dioxide from diffusing into either the second electrochemical cell or the first electrochemical cell and covering an entirety of the first electrochemical cell and the second electrochemical cell while exposing a first contact portion of the first current collector region and a second contact portion of the second current collector region; and forming a plurality of electrochemical cells numbered from 3 to N, where N is an integer greater than 200, configured between the second electrochemical cell and the top thin film barrier material;

wherein the reduction of stress is one third of a value of stress of any combination of the first collector region, the first cathode material, first electrolyte, or the second current collector without the intermediary thin film barrier material.

19. The method of claim 18 wherein the intermediary thin film barrier is characterized by a stress magnitude greater than two times of a stress magnitude of either the top thin film barrier layer or the bottom thin film barrier layer; and further comprising moving the flexible substrate as a roll.

* * * * *